United States Patent
Lander et al.

(10) Patent No.: US 7,326,631 B2
(45) Date of Patent: Feb. 5, 2008

(54) METHOD OF MANUFACTURING MOS TRANSISTORS WITH GATE ELECTRODES FORMED IN A PACKET OF METAL LAYERS DEPOSITED UPON ONE ANOTHER

(75) Inventors: Robert Lander, Leuven (BE); Jacob Christopher Hooker, Leuven (BE); Robertus Adrianus Maria Wolters, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/544,413

(22) PCT Filed: Jan. 15, 2004

(86) PCT No.: PCT/IB2004/050027

§ 371 (c)(1),
(2), (4) Date: Aug. 3, 2005

(87) PCT Pub. No.: WO2004/070833

PCT Pub. Date: Aug. 19, 2004

(65) Prior Publication Data

US 2006/0134848 A1    Jun. 22, 2006

(30) Foreign Application Priority Data

Feb. 3, 2003   (EP)   ................... 03100216

(51) Int. Cl.
*H01L 21/22* (2006.01)
*H01L 21/38* (2006.01)
(52) U.S. Cl. ............ 438/558; 438/510; 438/514; 257/E21.14; 257/E21.144

(58) Field of Classification Search ............... 438/128, 438/528, 652, 659, 658, 660, 666, 923, 924, 438/FOR. 405, 197, 199, 287, 510, 514, 438/517, 558, 559, FOR. 301, FOR. 320; 257/E27.108, 21.632, 21.637, E21.14, E21.141, 257/E21.144
See application file for complete search history.

(56) References Cited

U.S. PATENT DOCUMENTS 4,351,695 A * 9/1982 Hieber et al. ................ 117/9

(Continued)

OTHER PUBLICATIONS

Lander et al, "Control of a Metal Electrode Work Function by Solid-State Diffusion of Nitrogen", Material Research Society Symposium Proposals, vol. 716, No. B511, 2002. pp. 253-258.*

*Primary Examiner*—Fernando L. Toledo
*Assistant Examiner*—Quovaunda Jefferson
(74) *Attorney, Agent, or Firm*—Peter Zawilski

(57) ABSTRACT

Consistent with an example embodiment, a method of manufacturing a semiconductor device comprises MOS transistors having gate electrodes formed in a number of metal layers deposited upon one another. Active silicon regions having a layer of a gate dielectric and field-isolation regions insulating these regions from each other are formed in a silicon body. Then, a layer of a first metal is deposited in which locally, in a part of the active regions, nitrogen is introduced. On the layer of the first metal, a layer of a second metal is then deposited, after which the gate electrodes are etched in the metal layers. Before nitrogen is introduced into the first metal layer, an auxiliary layer of a third metal permeable to nitrogen is deposited an the first metal layer. Thus, the first metal layer can be nitrided locally without the risk of damaging the underlying gate dielectric.

4 Claims, 3 Drawing Sheets

U.S. PATENT DOCUMENTS

Figure 1:
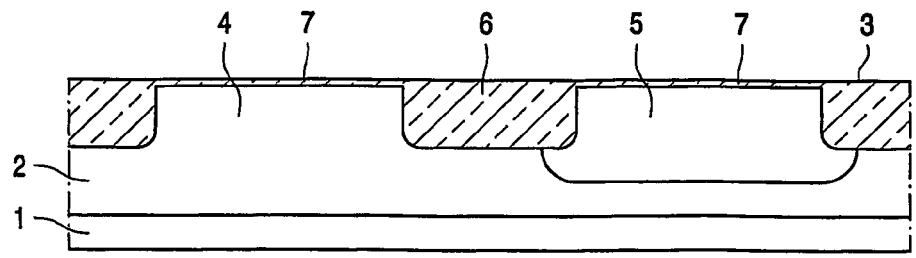

| | | | |
|---|---|---|---|
| 5,668,040 A * | 9/1997 | Byun | 438/396 |
| 6,162,713 A * | 12/2000 | Chen et al. | 438/585 |
| 6,451,690 B1 * | 9/2002 | Matsumoto et al. | 438/653 |
| 6,509,254 B1 * | 1/2003 | Matsumoto et al. | 438/591 |
| 2001/0015463 A1 | 8/2001 | Wakabayashi et al. | |
| 2002/0048636 A1 | 4/2002 | Matsumoto et al. | |
| 2002/0058374 A1 * | 5/2002 | Kim et al. | 438/228 |
| 2003/0180994 A1 * | 9/2003 | Polishchuk et al. | 438/199 |
| 2005/0054149 A1 * | 3/2005 | Xiang et al. | 438/199 |

* cited by examiner

METHOD OF MANUFACTURING MOS TRANSISTORS WITH GATE ELECTRODES FORMED IN A PACKET OF METAL LAYERS DEPOSITED UPON ONE ANOTHER

The invention relates to a method of manufacturing a semiconductor device with MOS transistors comprising gate electrodes formed in a packet of metal layers deposited upon one another, in which method, on a surface of a silicon body on which border active regions of silicon and field isolation regions insulating these regions with respect to each other, a layer of a gate dielectric is formed at the location of the active regions, after which a layer of a first metal is deposited wherein nitrogen is introduced at the location of a part of the active regions, after which a layer of a second metal is deposited on the layer of the first metal, and subsequently the gate electrodes are etched in the packet of superposed metal layers.

The term "metals" as used herein is to be taken to mean also conductive compounds of metals, such as for example metal silicides and metal nitrides. The layer of the first metal into which nitrogen is locally introduced, and which can thus be locally entirely converted to a metal nitride, consequently remains a layer of "metal".

Into the layer of the first metal, which is formed on the layer of gate dielectric, nitrogen is introduced at the location of a part of the active regions, as a result of which the first metal obtains a different work function there. The MOS transistors whose gate electrodes are formed in the layer of the first metal into which nitrogen is introduced thus exhibit a different threshold voltage than the MOS transistors whose gate electrodes are formed in the layer of the first metal into which no nitrogen is introduced. It is thus possible to manufacture a semiconductor device with MOS transistors that exhibit a different threshold voltage. The part of the active regions where nitrogen is introduced into the layer of the first metal, and the other active regions are then provided with a p-type or n-type doping in a corresponding manner. For some metals, such as titanium, the introduction of nitrogen may lead to so large an increase of the work function that NMOS and PMOS transistors can be manufactured which, in absolute terms, have an equal threshold voltage. The part of the active regions where nitrogen is introduced into the layer of the first metal is, for example, n-type doped, and the other active regions are p-type doped.

The layer of the second metal is provided in a comparatively large thickness, as a result of which the gate electrodes formed in the two layers exhibit a comparatively low electric resistance; in the gate electrodes, the layer of the first metal is "shunted" by the layer of the second metal.

US 2001/0015463 A1 describes a method of the type mentioned in the opening paragraph, in which an approximately 100 nm thick layer of titanium is deposited as the layer of the first metal. Nitrogen ions are locally implanted in this layer to change the work function. An approximately 200 nm thick layer of tungsten is deposited as the layer of the second material. On the layer of tungsten, an etch mask of silicon nitride is formed, after which the gate electrodes are etched in the packet of superposed layers of tungsten and titanium nitride.

If titanium is used as the metal for the gate electrodes, a maximum change, in this case an increase, of the work function is obtained if the layer of titanium, upon the introduction of nitrogen, is completely converted to a layer of titanium nitride. This requires a very large quantity of nitrogen to be implanted; in a layer of titanium having a thickness of 100 nm more than $5.10^{17}$ nitrogen atoms per cm$^2$ must be implanted. In practice this requires an expensive process step which is also very time consuming. The use of a thinner layer, so that converting this layer of titanium entirely to a layer of titanium nitride would require less nitrogen is impossible in practice because, during the ion implantation, the underlying gate dielectric could be damaged.

It is an object of the invention to obviate said drawbacks. To achieve this, the method is characterized in that before nitrogen is locally introduced into the layer of the first metal, an auxiliary layer of a third, nitrogen-permeable metal is formed on this layer. By virtue thereof, the layer of the first metal can be applied in a very small thickness of less than 10 nm, as a result of which, for example, the complete conversion of a layer of titanium to a layer of titanium nitride requires much less, i.e. a factor of 10, nitrogen than in the case of the known method described above. If the nitrogen is introduced into the layer of the first metal by means of ion implantation, then the energy with which the ion implantation can be carried out is such that practically all nitrogen ions are introduced into the auxiliary layer, so that the gate dielectric lying under the layer is not damaged. The nitrogen ions introduced into the auxiliary layer diffuse during a thermal treatment, which is customary in practice after an ion implantation, to the underlying layer of the first metal.

After nitrogen has been introduced into the layer of the first metal, the auxiliary layer may be removed. A simpler procedure is obtained, however, if, after nitrogen has been locally introduced into the layer of the first metal, the layer of the second metal is deposited on the auxiliary layer. In this case, during etching the gate electrodes in the packet of the three metal layers, the auxiliary layer can be advantageously used as an etch-stop layer during etching the layer of the second metal. During etching the relatively thick layer of the second metal, having a thickness of for example 200 nm, the much thinner layer of the first metal, having a thickness of for example approximately 10 nm, and the underlying layer of gate dielectric are protected by the auxiliary layer.

The risk of damage to the layer of the first metal and the underlying gate dielectric is much smaller if the nitrogen is introduced into the layer of the first metal by diffusion from a layer of a solid substance containing an excess of nitrogen which is provided on the auxiliary layer at the location of the active regions of the first conductivity type. After nitrogen has been introduced into the layer of the first metal, said solid nitrogen source can be removed using the auxiliary layer as an etch stop.

A substantially complete conversion of the first metal to a metal nitride can be achieved if a layer of $TiN_x$, where $x>1$, is provided on the auxiliary layer as a layer of a solid substance containing an excess of nitrogen. During the subsequent thermal treatment, nitrogen diffuses in atomic form through the auxiliary layer into the layer of the first metal, as a result of which a chemical reaction with the first metal can take place efficiently.

For the first metal, of which a layer is deposited on the layer of gate dielectric, use can be made of many metals, such as tantalum, molybdenum, zirconium, hafnium, vanadium and niobium, and metal silicides. Also for the auxiliary layer use can be made of many metals. Preferably, however, as the layer of the first metal, a layer of tantalum or molybdenum is deposited whose work function without nitrogen is 4.15 eV and 4.5 eV, respectively, and, after nitridation, 5.4 eV and 5.3 eV, respectively. For the auxiliary layer use is preferably made of a layer of cobalt or nickel, which metals are properly nitrogen-permeable and form an excellent etch stop when etching a layer of tungsten in a fluor-containing plasma that is deposited on said auxiliary layer. This enables substantial changes in work function to be achieved, and cobalt and nickel readily pass nitrogen, which is important in particular when use is made of a solid nitrogen source, while these layers are also very suitable as an etch stop when etch-patterning the layer of the second metal, which second metal may also be chosen from a large number of suitable metals, such as inter alia tungsten, which is very suitable.

These and other aspects of the invention are apparent from and will be elucidated with reference to the embodiment(s) described hereinafter.

Figure 5:
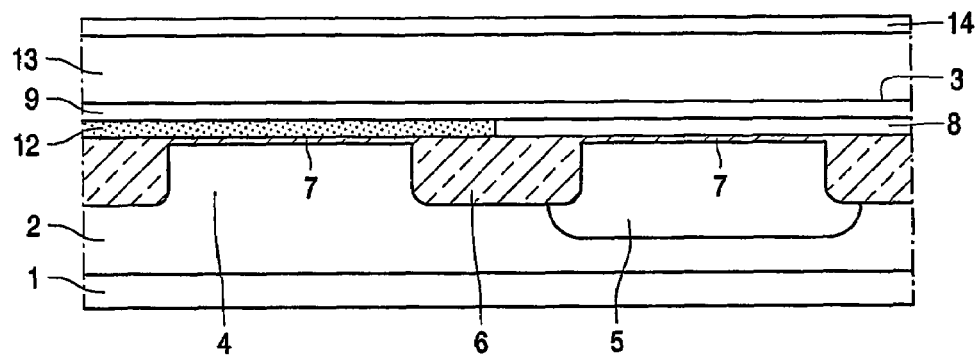
Figure 6:
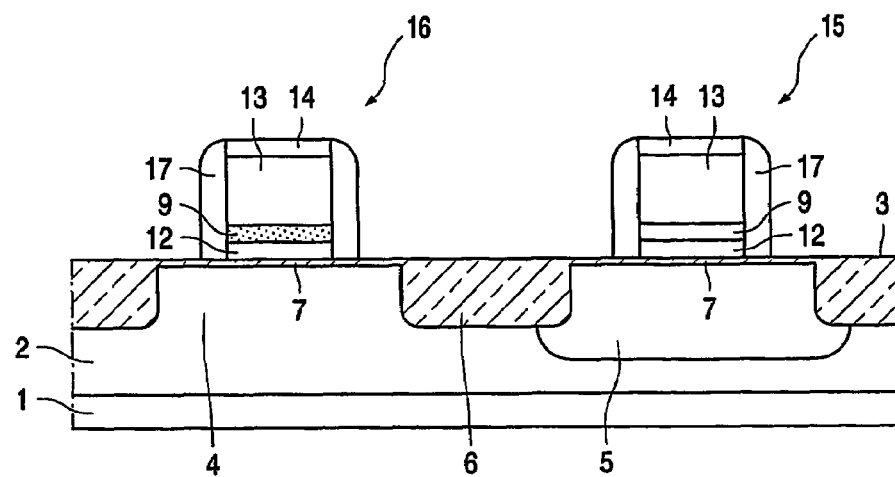
Figure 7:
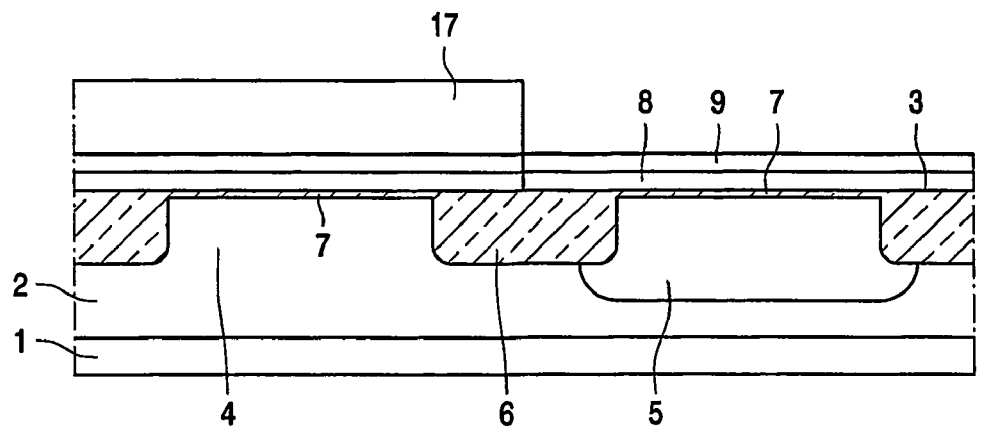
Figure 8:
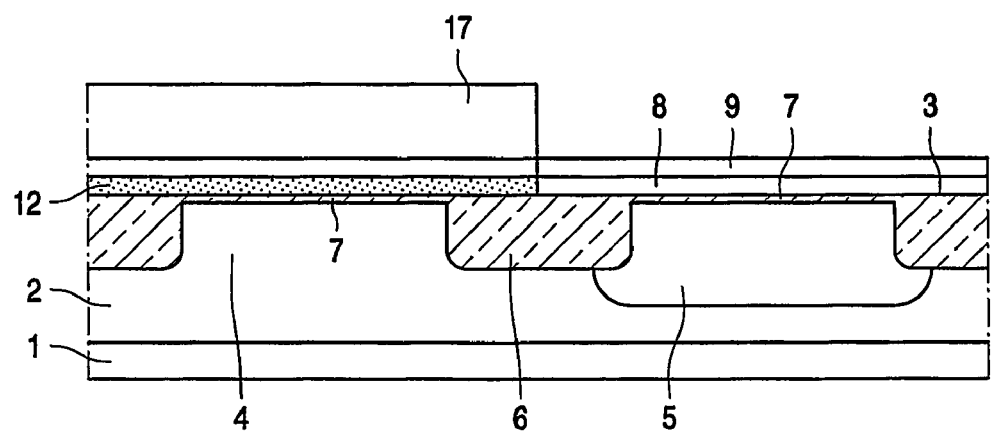

In the drawings:

FIGS. 1 through 6 are diagrammatic, cross-sectional views of several stages in the manufacture of a semiconductor device by means of a first embodiment of the method in accordance with the invention, and FIGS. 7 and 8 are diagrammatic, cross-sectional views of several stages in the manufacture of a semiconductor device by means of a second embodiment of the method in accordance with the invention.

FIGS. 1 through 6 are diagrammatic, cross-sectional views of several stages in the manufacture of a semiconductor device with PMOS and NMOS transistors comprising gate electrodes formed in a packet of metal layers deposited upon one another. In this case, as shown in FIG. 1, as a basis use is made of a silicon body 1 with a customary, epitaxially grown n-type top layer 2 and a surface 3 on which border active regions 4 of a first conductivity type, in this example n-type, and active regions 5 of the second conductivity type, in this example p-type. The n-type active regions 4 form part of the epitaxially grown layer 2, the p-type active regions are formed therein by ion implantation. The active regions 4 and 5 are insulated with respect to each other by field isolation regions 6 which also border on the surface 3. At the location of the active regions 4, the PMOS transistors are formed, and at the location of the active regions 5, the NMOS transistors are formed.

It is to be noted that the method can also suitably be used to manufacture a semiconductor device with MOS transistors of the same type (N or P) which have a different threshold voltage. At the location of a part of the active regions, nitrogen is then introduced into the layer of the first metal, so that the transistors at said locations obtain a threshold voltage that is different from that of the transistors formed at the location of the other active regions. In this case, all active regions are p-type or n-type doped in the same manner.

As is also shown in FIG. 1, an approximately 5 nm thick layer of a gate dielectric 7 is formed at the location of the p-type active regions 4 and the n-type active regions 5. This can be achieved by thermal oxidation of silicon that borders on the surface 3, but also by deposition of a layer of a suitable material. If the layer is deposited, not only silicon oxide but also, for example, silicon oxynitride or aluminum oxide can be used as the gate dielectric.

Figure 2:
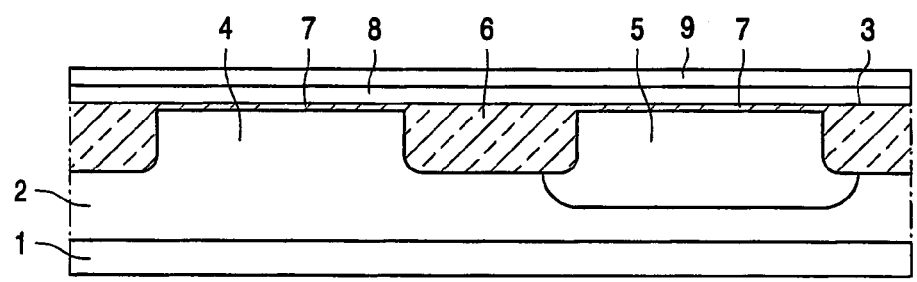

As shown in FIG. 2, a layer 8 of a first metal, in this example an approximately 10 nm thick layer of tantalum or molybdenum, is deposited on the structure shown in FIG. 1. Nitrogen is introduced into this layer at the location of a part of the active regions, in this example at the location of the n-type active regions 4. As a result, the first metal obtains a higher work function at said locations. It can thus be achieved that the work function of the first metal 8 at the location of the n-type active regions 4 becomes so much higher than that of the first metal 8 at the location of the p-type active regions 5, that, measured in absolute terms, the threshold voltage of the PMOS and NMOS transistors to be formed is equal,.

Figure 3:
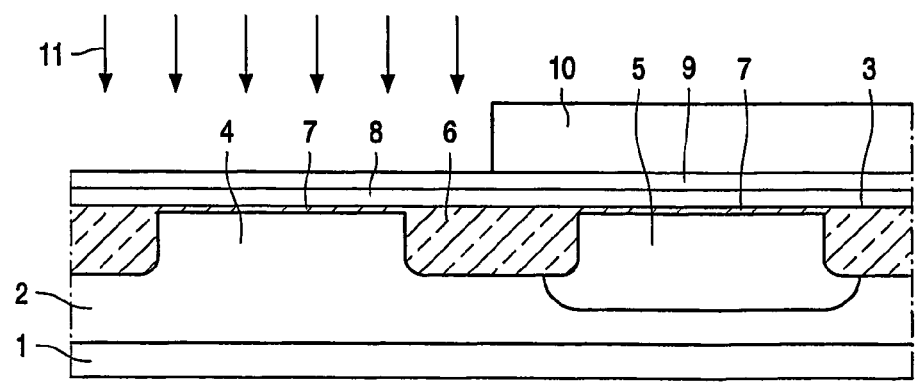
Figure 4:
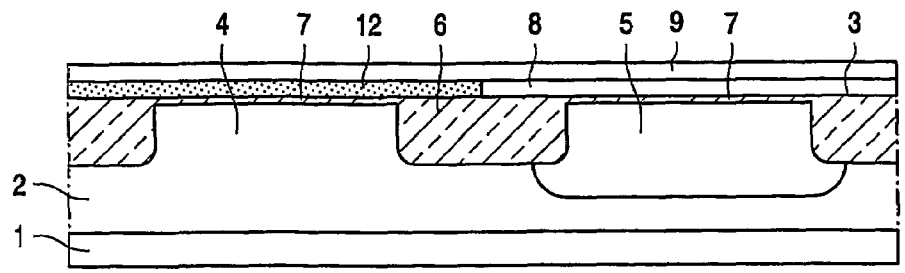

In the first exemplary embodiment of the method, the nitrogen is introduced into the layer of the first metal 8 by means of ion implantation. First an auxiliary layer 9, in this example an approximately 10 nm thick layer of cobalt or nickel, is deposited on the layer of the first metal 8. Subsequently, as shown in FIG. 3, a customary photoresist mask 10 is provided on the auxiliary layer 9, which mask covers the layer of the first metal at the location of the p-type active regions 5 and leaves said layer exposed at the location of the n-type regions 4. After the formation of the photoresist mask 10, nitrogen ions are introduced into the layer of the first metal 8, as diagrammatically indicated in FIG. 3 by means of arrows 11. After the ion implantation, the photoresist mask 10 is removed. At the location of the n-type active regions 4, the layer of the first metal 8 is preferably converted to a layer 12 of a nitride of the first metal; the greatest possible increase of the work function of the first metal is thus achieved.

The layer of the first metal 8 has, in this case, a thickness of only 10 nm. By virtue thereof, the layer 8 can be completely converted to a layer 12 of metal nitride by means of a comparatively small quantity of nitrogen. What is required for this is a dose of approximately $5 \cdot 10^{16}$ nitrogen ions per $cm^2$. The ion implantation can be carried out with such energy, in this case 0.5 keV, that practically all the nitrogen ions are introduced into the auxiliary layer 9, so that the gate dielectric 7 situated underneath the layer of the first metal 8 is not damaged. The nitrogen ions introduced into the auxiliary layer 9 diffuse during a thermal treatment, carried out after the implantation process, to the underlying layer of the first metal. In this example, the silicon body 1 is heated at a temperature of approximately 800° C. for approximately 30 seconds.

After the layer of the first metal 8 has been locally converted to a layer of metal nitride 12, an approximately 200 nm thick layer 13 of a second metal, here a layer of tungsten, is deposited. On this layer an approximately 100 nm thick layer of silicon nitride 14 is further deposited. The gate electrodes 15 for the NMOS transistors are formed in the layer packet 8, 9, 13, 14 thus formed, as shown in FIG. 6, and the gate electrodes 16 for the PMOS transistors are formed in the layer packet 12, 9, 13, 14 thus formed. The layers of silicon nitride 14 and tungsten 13 are etched in a fluor-containing plasma formed in a gas mixture containing $CF_4$ and $CHF_3$, after which the auxiliary layer of cobalt or nickel is removed by wet etching in an etch bath containing sulfuric acid and peroxide, whereafter the layer of the first metal 8, 12 is etched in said fluor-containing plasma. The gate electrodes are further provided with insulating spacers 17 in a customary manner. The layer of the second metal 13 is provided in a comparatively large thickness, as a result of which the gate electrodes 15, 16 formed exhibit a comparatively low electric resistance; in the gate electrodes, the layer of the first metal 8, 12 is "shunted" by the layer of the second metal 13.

After the introduction of nitrogen into the layer of the first metal 8, the auxiliary layer 9 is not removed, in this case. During etching the gate electrodes 15, 16 in the packets of layers, the auxiliary layer is used as an etch stop in the process of etching the layer of the second metal. The layer of the first metal 8, the layer of nitride of the first metal 12 and the underlying layer of the gate dielectric 7 are protected by the auxiliary layer 9.

FIGS. 7 and 8 diagrammatically show a different method of introducing nitrogen into the layer of the first metal 8. As shown in FIG. 7, layer 17 of a solid substance containing an excess of nitrogen is provided on the auxiliary layer 9, at the location of the n-type active regions 4. Preferably, a layer of $TiN_x$, where x >1, is provided as the layer 17 of a solid substance containing an excess of nitrogen. This is carried out, for example, in a customary sputtering apparatus wherein a target of titanium is sputtered by a plasma formed in a gas mixture with argon and an excess of nitrogen. From the layer 17 the nitrogen is introduced into the layer of the first metal 8 by diffusion of nitrogen through the auxiliary layer 9. For this purpose, the silicon body 1 is heated at a temperature of approximately 700° C. for approximately 30 seconds. In this process, nitrogen diffuses in atomic form through the auxiliary layer 9 into the layer of the first metal 12; as a result, the chemical reaction takes place very efficiently.

After the introduction of nitrogen into the layer of the first metal 8, whereby this layer is converted to a layer of metal nitride 12, the solid nitrogen source 17 is etched away in an etch bath with ammonia and peroxide. The auxiliary layer 9 of cobalt or nickel is used as an etch stop in this process. The manufacture of the transistors further proceeds as shown in FIGS. 5 and 6.

For the first metal, of which a layer 8 is deposited on the layer of gate dielectric 7, use can be made of many metals, such as tantalum, molybdenum, zirconium, hafnium, vanadium and niobium, as well as metal silicides. Also for the auxiliary layer 9 use can be made of many metals. Preferably, however, as described in the examples, a layer of tantalum or molybdenum is deposited as a layer of the first metal 8, on which a layer of cobalt or nickel is deposited as the auxiliary layer 9. This enables substantial changes in work function to be achieved, and cobalt and nickel readily pass nitrogen, which is important in particular when use is made of the solid nitrogen source 17, while these layers are also very suitable as an etch stop when etch-patterning the layer of the second metal, which second metal may also be chosen from a large number of suitable metals, such as inter alia tungsten as used in the examples.

The invention claimed is:

1. A method of manufacturing a semiconductor device with MOS transistors comprising gate electrodes formed in a packet of metal layers deposited upon one another, in which method, on a surface of a silicon body on which border active regions of silicon and field isolation regions insulating these regions with respect to each other, a layer of a gate dielectric is formed at the location of the active regions, after which a layer of a first metal is deposited wherein nitrogen is introduced at the location of a part of the active regions, after which a layer of a second metal is deposited on the layer of the first metal, and subsequently the gate electrodes are etched in the packet of superposed metal layers, characterized in that before nitrogen is locally introduced into the layer of the first metal, an auxiliary layer of a third, nitrogen-permeable metal is formed on this layer, characterized in that the nitrogen is locally introduced into the layer of the first metal by diffusion from a solid substance that contains an excess of nitrogen and is locally provided on the auxiliary layer.

2. A method as claimed in claim 1, characterized in that a layer of $TiN_x$, where x>1, is locally provided on the auxiliary layer as a layer of a solid substance containing an excess of nitrogen, after which a thermal treatment is carried out wherein nitrogen diffuses through the auxiliary layer into the layer of the first metal.

3. A method as claimed in claim 1, characterized in that a layer of tantalum or molybdenum is deposited as the layer of the first metal, on which a layer of cobalt or nickel is deposited as the auxiliary layer.

4. A method as claimed in claim 2, characterized in that a layer of tantalum or molybdenum is deposited as the layer of the first metal, on which a layer of cobalt or nickel is deposited as the auxiliary layer.

* * * * *